United States Patent
Wang et al.

(10) Patent No.: US 10,833,269 B1
(45) Date of Patent: Nov. 10, 2020

(54) 3D PHASE CHANGE MEMORY

(71) Applicant: INTERNATIONAL BUSINESS MACHINES CORPORATION, Armonk, NY (US)

(72) Inventors: Wei Wang, Yorktown Heights, NY (US); Balasubramanian Pranatharthiharan, Watervliet, NY (US); Injo Ok, Loudonville, NY (US); Kevin W. Brew, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/405,133

(22) Filed: May 7, 2019

(51) Int. Cl.
*H01L 45/00* (2006.01)
*H01L 27/24* (2006.01)

(52) U.S. Cl.
CPC ...... *H01L 45/1683* (2013.01); *H01L 27/2436* (2013.01); *H01L 27/2481* (2013.01); *H01L 45/06* (2013.01); *H01L 45/1233* (2013.01); *H01L 45/1293* (2013.01); *H01L 45/144* (2013.01)

(58) Field of Classification Search
CPC . H01L 27/2436; H01L 27/2481; H01L 45/06; H01L 45/1233; H01L 45/1293; H01L 45/144; H01L 45/1683
See application file for complete search history.

(56) References Cited

U.S. PATENT DOCUMENTS

| | | |
|---|---|---|
| 8,138,028 B2 | 3/2012 | Lung et al. |
| 8,546,861 B2 | 10/2013 | Hwang |
| 9,076,958 B2 | 7/2015 | Ahn |
| 9,293,348 B2 | 3/2016 | Lai et al. |
| 9,570,169 B1 | 2/2017 | Czomomaz et al. |
| 9,672,917 B1 | 6/2017 | Costa et al. |
| 2008/0149913 A1* | 6/2008 | Tanaka ............... H01L 27/2454 257/5 |
| 2009/0090899 A1* | 4/2009 | Lim ..................... H01L 45/144 257/4 |
| 2011/0169067 A1 | 7/2011 | Ernst et al. |
| 2012/0248399 A1 | 10/2012 | Sasago et al. |
| 2013/0126814 A1* | 5/2013 | Kim .................... H01L 27/2409 257/2 |

(Continued)

OTHER PUBLICATIONS

Fong et al., "Phase-Change Memory—Towards a Storage-Class Memory", IEEE Transactions on Electron Devices. Nov. 2017. vol. 64. No. 11. pp. 4374-4385.

(Continued)

*Primary Examiner* — Allan R Wilson
(74) *Attorney, Agent, or Firm* — Tutunjian & Bitetto, P.C.; Randall Bluestone (57) ABSTRACT

A method is presented for constructing a three-dimensional (3D) stack phase change memory (PCM) device. The method includes forming a plurality of stack layers over a plurality of conductive lines, the plurality of conductive lines formed within trenches of an inter-layer dielectric (ILD), forming isolation trenches extending through the plurality of stack layers, etching the plurality of stack layers to define an opening, filling the opening with at least a phase change material, and constructing vias to the plurality of conductive lines.

20 Claims, 7 Drawing Sheets

(56) References Cited

U.S. PATENT DOCUMENTS

2013/0141968 A1* 6/2013 Sasago .................... H01L 45/06
                                                                      365/163

OTHER PUBLICATIONS

Kinoshita et al., "Scalable 3-D vertical chain-cell-type phase-change memory with 4F2 poly-Si diodes", 2012 Symposium on VLSI Technology Digest of Technical Papers. Jun. 12, 2012. pp. 35-36.

* cited by examiner

3D PHASE CHANGE MEMORY

BACKGROUND

The present invention relates generally to semiconductor devices, and more specifically, to a cylindrical phase change memory structure.

A phase-change memory (PCM) is one of next-generation nonvolatile memory devices that are expected to meet an increasing demand for a high-performance and low-power semiconductor memory device. In PCM devices, data can be stored or erased by heating or cooling a phase-change layer therein. However, there can be thermal interference between adjacent memory cells.

SUMMARY

In accordance with an embodiment, a method is provided for constructing a three-dimensional (3D) stack phase change memory (PCM) device. The method includes forming a plurality of stack layers over a plurality of conductive lines, the plurality of conductive lines formed within trenches of an inter-layer dielectric (ILD), forming isolation trenches extending through the plurality of stack layers, etching the plurality of stack layers to define an opening, filling the opening with at least a phase change material, and constructing vias to the plurality of conductive lines.

In accordance with another embodiment, a method is provided for constructing a cylindrical phase change memory (PCM) structure. The method includes forming a plurality of stack layers over a plurality of conductive lines, the plurality of stack layers including at least thermal insulator layers, forming isolation trenches extending through the plurality of stack layers, etching the plurality of stack layers to define a cavity, and filling the cavity with at least a phase change material.

In accordance with yet another embodiment, a cylindrical phase change memory (PCM) structure is provided. The structure includes a plurality of stack layers disposed over a plurality of conductive lines, the plurality of conductive lines formed within trenches of an inter-layer dielectric (ILD), isolation trenches extending through the plurality of stack layers, a phase change material disposed within an opening formed in the plurality of stack layers, and a top electrode disposed adjacent the phase change material in the opening.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a cylindrical phase change memory (PCM) structure. The exemplary embodiments present a method and structure of a 3D stack PCM device where blanket bottom electrode (BE) films are deposited by, e.g., physical vapor deposition (PVD) to improve fabrication throughput and Ge—Sb—Te (germanium-antimony-tellurium or GST) is deposited in a via. Thermal insulation layers are placed between dielectric and bottom contact layers to reduce thermal dissipation. The heating metal is located next to the PCM and separated from the drain contact. Additionally, the multi-heater layer allows for more efficient operation of the PCM. Thus, new heater metal is formed between word lines and GST.

Embodiments in accordance with the present invention provide methods and devices for employing phase change based materials in nonvolatile random access memory cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
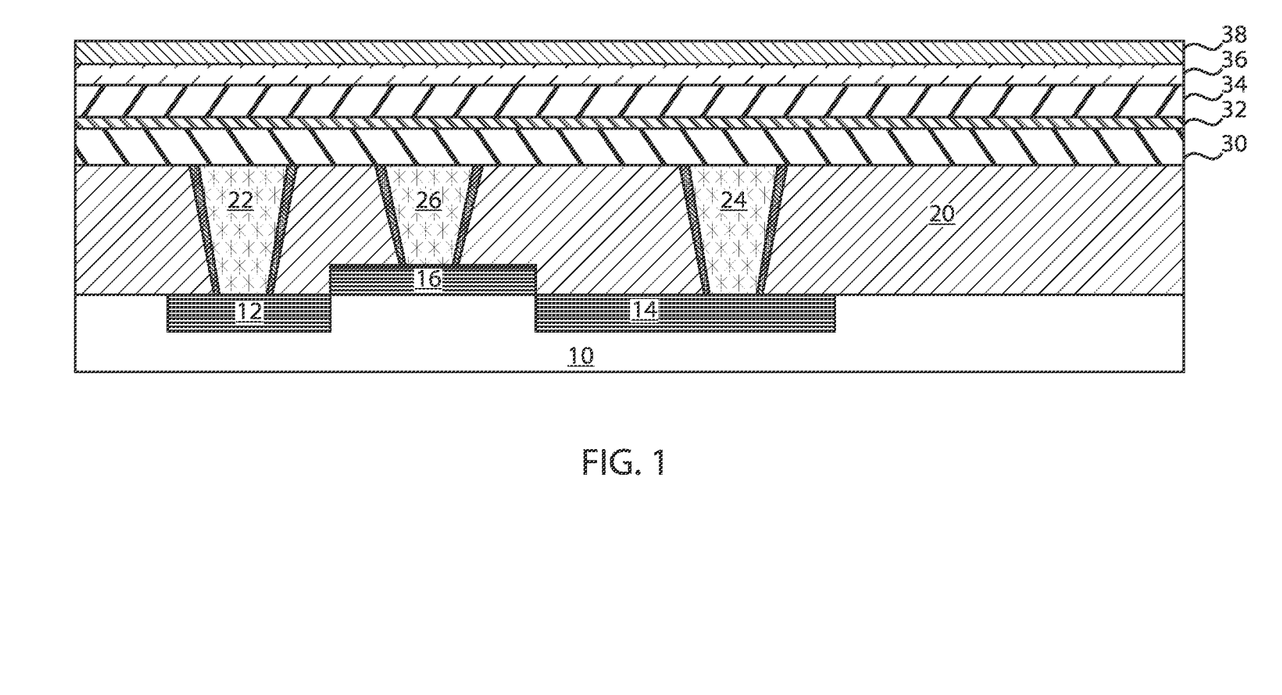
FIG. 1 is a cross-sectional view of a structure including a plurality of first stack layers with transistors formed underneath, in accordance with an embodiment of the present invention.

FIG. 1 is a cross-sectional view of a structure including a plurality of first stack layers with transistors formed underneath, in accordance with an embodiment of the present invention.

The structure includes a plurality of conductive lines 22, 24, 26 formed within trenches of an inter-layer dielectric (ILD) 20. The ILD 20 can be formed over a substrate 10. A conductive fill material or liner can be formed or deposited around each of the trenches. In one example, the liner can be a tantalum nitride (TaN) liner or in the alternative a tantalum (Ta) liner. In one example embodiment, the conductive fill material can be deposited, for example, by electroplating, electroless plating, chemical vapor deposition (CVD), atomic layer deposition (ALD) and/or physical vapor deposition (PVD).

A first metal line 22 can extend to a source region 12, a second metal line 24 can extend to a drain region 14, and a third metal line 26 can extend to a gate region 16. A plurality of stack layers can be formed over the source region 12, the drain region 14, and the gate region 16. The plurality of stack layers includes a first layer 30, a second layer 32, a third layer 34, a fourth layer 36, and a fifth layer 38.

The first layer 30 can be, e.g., a first dielectric layer 30. The second layer 32 can be, e.g., a first thermal insulator layer 32. The third layer 34 can be, e.g., a conductive layer 34 or bottom electrode. The fourth layer 36 can be, e.g., a second thermal insulator layer 36. The fifth layer 38 can be, e.g., a second dielectric layer 38. Thus, the conductive layer 34 or bottom electrode is confined between the first thermal insulator layer 32 and the second thermal insulator layer 36.

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The ILD 20 can include any materials known in the art, such as, for example, porous silicates, carbon doped oxides, silicon dioxides, silicon nitrides, silicon oxynitrides, or other dielectric materials. The ILD 20 can be formed using any method known in the art, such as, for example, chemical vapor deposition, plasma enhanced chemical vapor deposition, atomic layer deposition, or physical vapor deposition. The ILD 20 can have a thickness ranging from about 25 nm to about 200 nm.

The metal lines 22, 24, 26 can be formed in the openings or trenches formed in the ILD 20. The metal lines 22, 24, 26 can be any conductive materials known in the art, such as, for example, copper (Cu), aluminum (Al), or tungsten (W). The metal lines 22, 24, 26 can be fabricated using any technique known in the art, such as, for example, a single or dual damascene technique. In an embodiment, not illustrated, the metal lines 22, 24, 26 can be copper (Cu) and can include a metal liner, where a metal liner can be metals, such as, for example, tantalum nitride and tantalum (TaN/Ta), titanium, titanium nitride, cobalt, ruthenium, and manganese. The metal lines 22, 24, 26 can be referred to as contacts.

In various exemplary embodiments, source/drain regions 22, 24 are formed within the ILD 20.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The dielectric layers 30, 38 can include, but are not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The thermal insulator layers 32, 36 can reduce thermal dissipation. The thermal insulator layers 32, 36 can be, e.g., SiN, $SiO_2$, SiBCN, SiCN, or a low-k dielectric such as SiCOH or octamethylcyclotetrasiloxane (OMCTS) 2.7 ILD (interlayer dielectric).

The conductive layer 34 can include a conductive material, such as Cu, Al, Ag, Au, Pt, W, etc. In some embodiments, the conductive layer 34 can include nitrides such as TiN, TaN, Ta or Ru.

In one example, the dielectric layers 30, 38, the thermal insulator layers 32, 36, and the conductive layer 34 are deposited by PVD.

Figure 2:
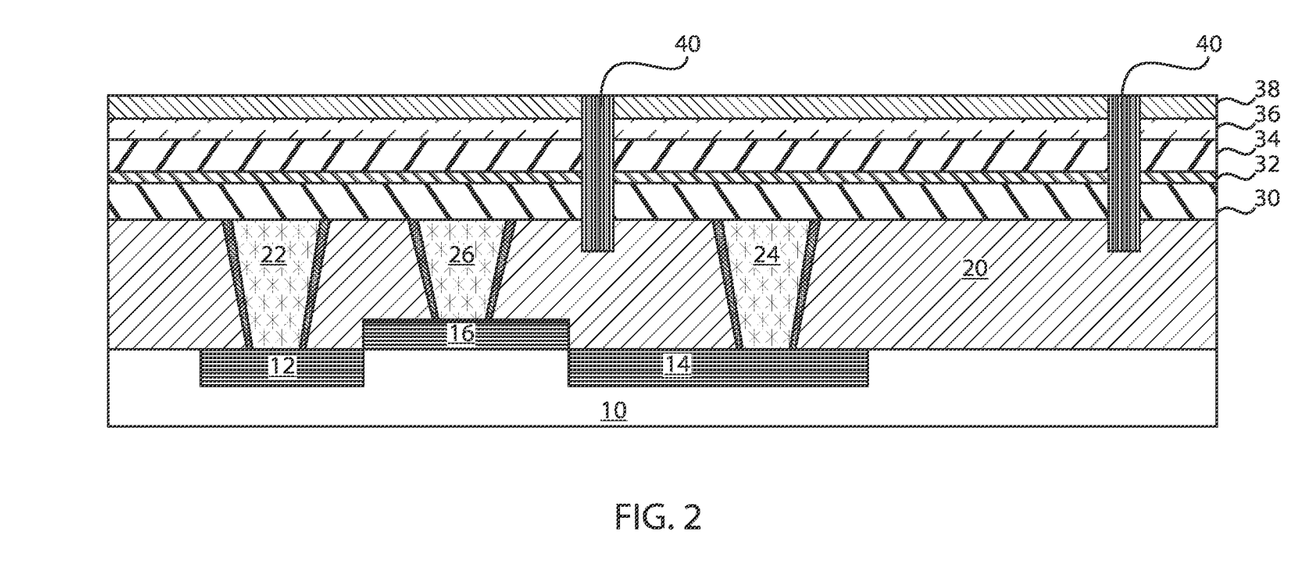
FIG. 2 is a cross-sectional view of the structure of FIG. 1 where isolation trenches are formed through the plurality of first stack layers, in accordance with an embodiment of the present invention.

FIG. 2 is a cross-sectional view of the structure of FIG. 1 where isolation trenches are formed through the plurality of first stack layers, in accordance with an embodiment of the present invention.

In various example embodiments, isolation trenches 40 are formed through the plurality of first stack layers 30, 32, 34, 36, 38. The isolation trenches 40 extend through the plurality of first stack layers 30, 32, 34, 36, 38 and into the ILD 20. The isolation trenches 40 can be referred to as shallow trench isolation (STI) regions or trench isolation structures. The trench isolation structures 40 can be formed by an STI technique that relies on a lithography and dry etching process to define closed-bottomed trenches in ILD 20, deposit an electrical insulator to fill the trenches, and planarize the electrical insulator relative to the top surface of the ILD 20 using, e.g., a chemical mechanical polishing (CMP) process.

Figure 3:
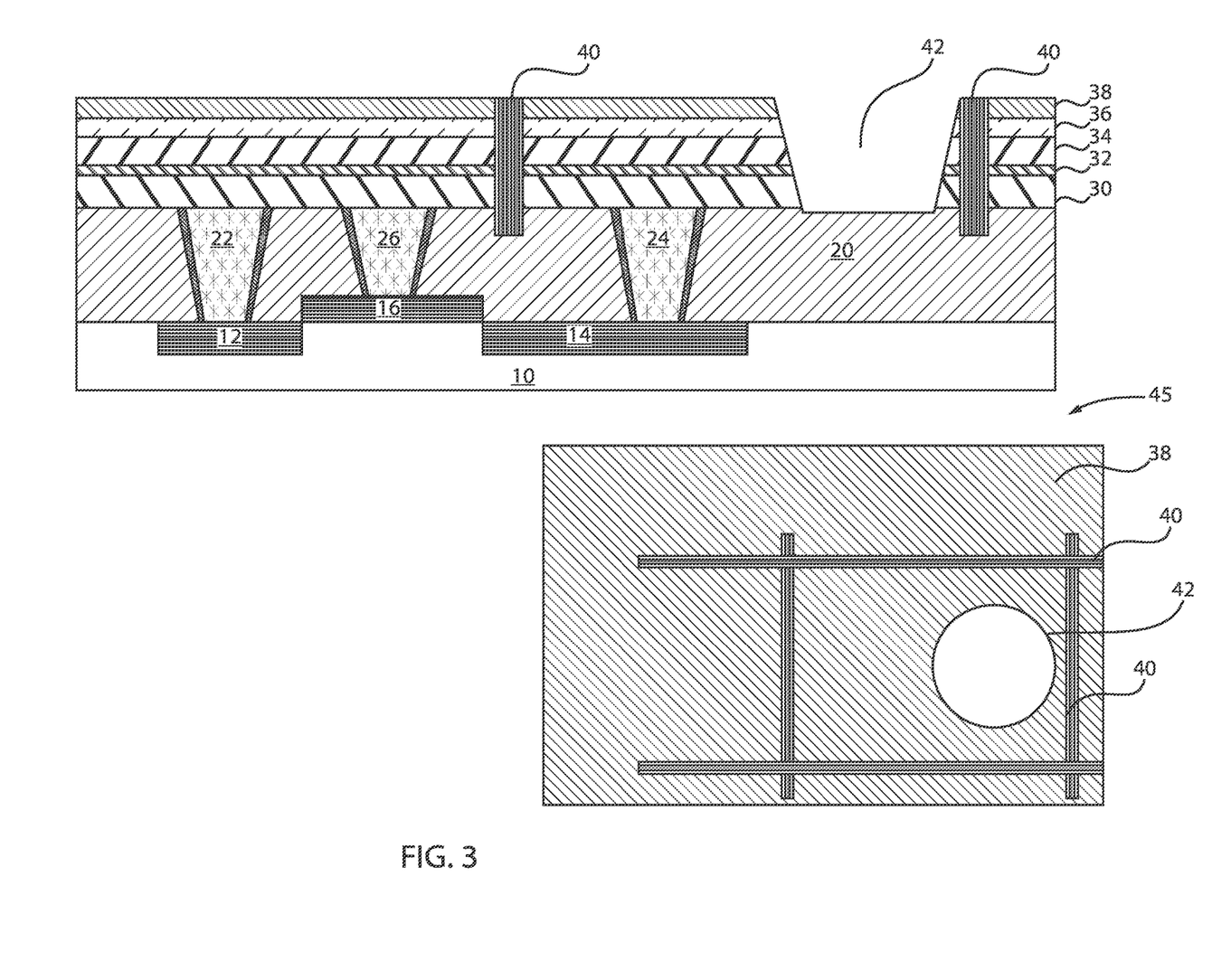
FIG. 3 is a cross-sectional view of the structure of FIG. 2 where an opening is formed between the isolation trenches, in accordance with an embodiment of the present invention.

FIG. 3 is a cross-sectional view of the structure of FIG. 2 where an opening or cavity is formed between the isolation trenches, in accordance with an embodiment of the present invention.

In various example embodiments, an opening or cavity 42 is formed between the isolation trenches 40. The opening 42 extends through the plurality of first stack layers 30, 32, 34, 36, 38 and into the ILD 20 by, e.g., an isotropic etching process, such as a wet chemical etch, that stops on the ILD 20. If the dielectric layers 30, 38 include silicon oxide ($SiO_2$), the wet chemical etching process can use either dilute hydrofluoric (DHF) or buffered hydrofluoric (BHF) as an etchant.

Figure 4:
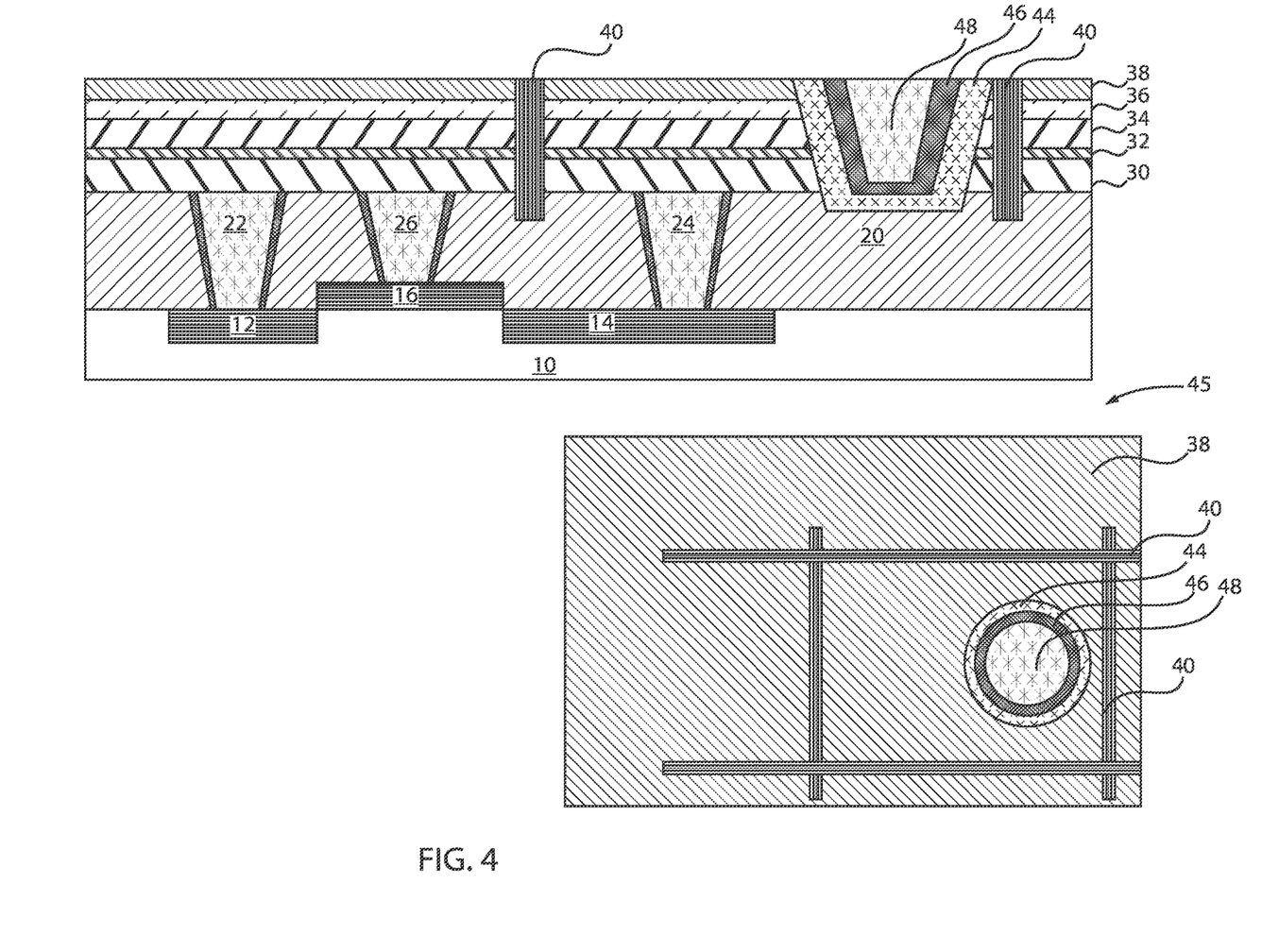
FIG. 4 is a cross-sectional view of the structure of FIG. 3 where the opening is filled with a phase change material, a top electrode, and a conductive material, in accordance with an embodiment of the present invention.

FIG. 4 is a cross-sectional view of the structure of FIG. 3 where the opening is filled with a phase change material, a top electrode, and a conductive material, in accordance with an embodiment of the present invention.

In various example embodiments, the cavity 42 is filled with a phase change material 44, a top electrode 46, and a conductive material 48. The phase change material 44 directly contacts the inner walls or surfaces of the cavity 42 and directly contacts the ILD 20. The top electrode 46 can be deposited within the phase change material 44. The top electrode 46 directly contacts the inner walls or surfaces of the phase change material 44. The conductive material 48 can be deposited adjacent the top electrode 46.

A height of the phase change material 44, the top electrode 46, and the conductive material 48 can be reduced by chemical-mechanical polishing (CMP) and/or etching. Therefore, the planarization process can be provided by CMP. Other planarization processes can include grinding and polishing.

Phase change material 44 can be changed from one phase state to another by application of electrical pulses. A shorter, higher amplitude pulse tends to change the phase change material 44 to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to melt the material in the active volume, and short enough to allow the material to solidify in the amorphous state.

The phase change material 44 can include chalcogenide based materials and other materials. Chalcogens include any of the four elements oxygen (O), sulfur (S), selenium (Se), and tellurium (Te), forming part of group VI of the periodic table. Chalcogenides include compounds of a chalcogen with a more electropositive element or radical. Chalcogenide alloys include combinations of chalcogenides with other materials such as transition metals. A chalcogenide alloy usually includes one or more elements from column six of the periodic table of elements, such as germanium (Ge) and tin (Sn). Often, chalcogenide alloys include combinations including one or more of antimony (Sb), gallium (Ga), indium (In), and silver (Ag). Phase change based memory materials can include alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable.

Chalcogenides and other phase change materials are doped with impurities in some embodiments to modify conductivity, transition temperature, melting temperature, and other properties of memory elements using the doped chalcogenides. Representative impurities employed for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

In the present example, the phase change material layer 44 preferably includes a Ge—Sb—Te (germanium-antimony-tellurium or "GST") alloy. Alternatively, other suitable materials for the phase change material layer 44 optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

The phase change material layer 44 is configured to be substantially amorphous following back-end-of-line ("BEOL") semiconductor processing. In one example, the phase change material layer 44 can be deposited with a thickness that is less than about 20 nm and a deposition temperature that is less than about 200° C. The phase change material layer 44 can be deposited by a physical vapor deposition ("PVD") (also referred to as "sputtering") process.

GST material 44 has a melting point of about 620° C., and is capable of existing in amorphous and crystalline states. To form the amorphous (high resistivity) phase, at least a portion of the material is heated to a temperature above the melting point thereof by applying a relatively high current through the material between the electrodes (the heat being generated due to the electrical resistance of the phase change material) for as little as 10 to 100 nanoseconds. As the GST material 44 quickly cools when the current is interrupted, the atoms of the GST do not have sufficient time to form an ordered crystalline state, and the amorphous phase of the GST material 44 is formed. To form the crystalline (low resistivity) phase, at least a portion of the material can be heated to a temperature of about 550° C., which is above the crystallization temperature and near, but below, the melting point of the GST material, by applying a relatively lower current through the GST material 44 between the electrodes for a sufficient amount of time (e.g., as little as about 30 nanoseconds) to allow the atoms of the GST material 44 to assume the long-range order associated with the crystalline phase, after which the current flowing through the material can be interrupted. The current passed through the phase change material to cause a phase change therein can be referred to as the "programming current."

The electrode 46 can be, e.g., formed from Ta, Ti/TiN, W, WN, TaN, polysilicon, doped polysilicon, amorphous silicon, doped amorphous silicon, or any other suitable material, or any other conductive material. Alternatively, the electrode 46 can be, e.g., any suitable conductive material or materials, e.g., Ag, Al, Cu, Ta, TaN, Ti, TiN, Al, W or any other suitable material, and can be deposited or formed in any suitable manner.

The conductive material 48 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Top view 45 illustrates the cylindrical PCM structure. The phase change material 44, the top electrode 46, and the conductive material 48 each have a substantially cylindrical shape extending through the first stack layers 30, 32, 34, 36, 38. The phase change material 44, the top electrode 46, and the conductive material 48 each have a tapered configuration. The top end of the tapered configuration has a critical dimension that is greater than or larger than the critical dimension of the bottom end of the tapered configuration.

Figure 5:
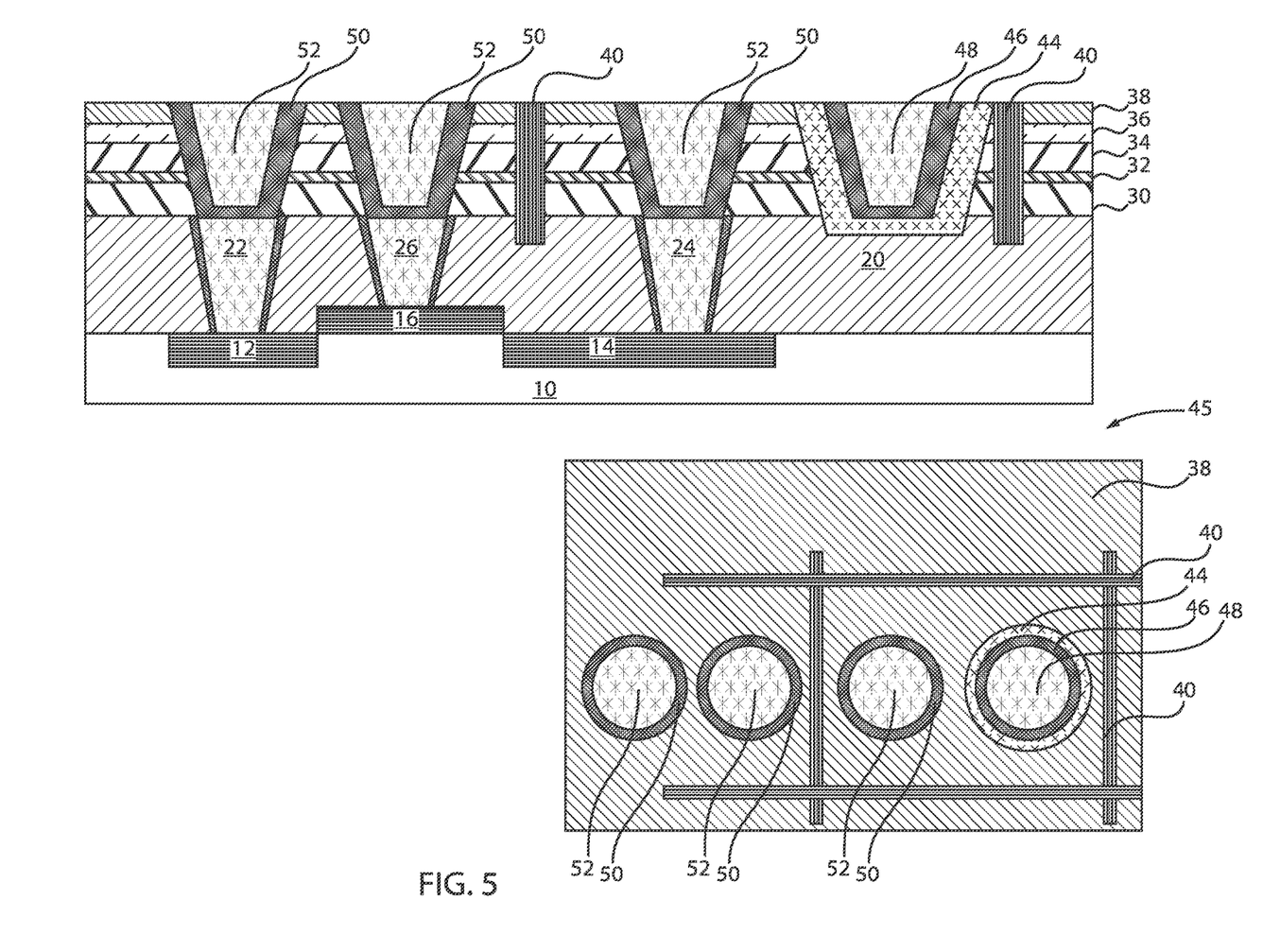
FIG. 5 is a cross-sectional view of the structure of FIG. 4 where vias are formed to the transistors and filled with a conductive material, in accordance with an embodiment of the present invention.

FIG. 5 is a cross-sectional view of the structure of FIG. 4 where vias are formed to the transistors and filled with a conductive material, in accordance with an embodiment of the present invention.

In various example embodiments, vias are formed to the transistors and filled with a conductive material 52. After the vias are formed, a conductive fill material or liner 50 is formed within the inner surfaces of the vias. The conductive material 52 is deposited on the liners 50 surrounding the vias. The vias are aligned with the source, drain, and gate regions 22, 24, 26.

Top view 45 illustrates the cylindrical PCM structure, as well as the conductive materials 52 within the liner 50 defined over the source, drain, and gate regions 22, 24, 26.

Additionally, the contact area of the cylindrical PCM structure is less than the contact area of a conventional mushroom PCM structure. For instance, for the cylindrical PCM structure of the present invention, $S_{stack}=2*pi*r*h$, where r is approximately 18 nm. R is the radius measured between the center of the conductive material 52 and an outer surface of the top electrode 46. The height, h, is the height of the conductive layer 34.

Figure 6:
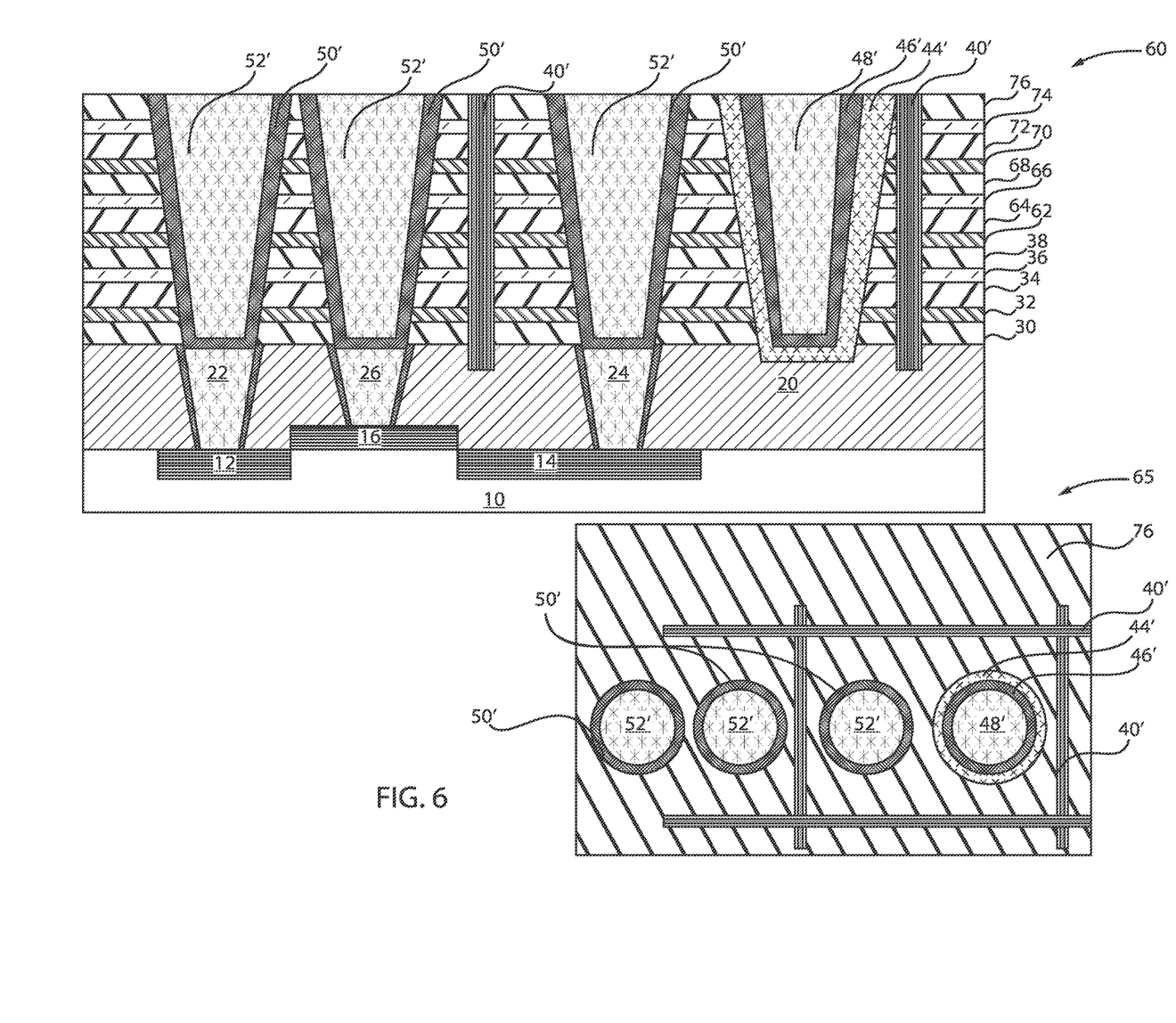
FIG. 6 is a cross-sectional view of a structure including a plurality of second stack layers with transistors formed underneath, where vias are formed to the transistors and filled with a conductive material, in accordance with another embodiment of the present invention.

FIG. 6 is a cross-sectional view of a structure including a plurality of second stack layers with transistors formed underneath, where vias are formed to the transistors and filled with a conductive material, in accordance with another embodiment of the present invention.

In various example embodiments, a plurality of second stack layers are illustrated with transistors formed underneath, where vias are formed to the transistors and filled with a conductive material.

FIG. 1 illustrates a plurality of first stack layers 30, 32, 34, 36, 38. In FIG. 6, a plurality of second stack layers 62-76 are formed over the plurality of first stack layers 30, 32, 34, 36, 38.

In various example embodiments, vias are formed to the transistors and filled with a conductive material 52'. After the vias are formed, a conductive fill material or liner 50' is formed within the inner surfaces of the vias. The conductive material 52' is deposited on the liners 50' surrounding the vias. The vias are aligned with the source, drain, and gate regions 22, 24, 26. The isolation trenches 40' extend through the plurality of first stack layers 30, 32, 34, 36, 38 and through the plurality of second stack layers 62-76, such that the isolation trenches 40' end in the ILD 20. Thus, in the structure 60, the metal contacts extend through all of the plurality of first and second stack layers.

A cavity is filled with a phase change material 44', a top electrode 46', and a conductive material 48'. The phase change material 44' directly contacts the inner walls or surfaces of the cavity and directly contacts the ILD 20. The top electrode 46' can be deposited within the phase change material 44'. The top electrode 46' directly contacts the inner walls or surfaces of the phase change material 44'. The conductive material 48' can be deposited adjacent the top electrode 46'.

A height of the phase change material 44', the top electrode 46', and the conductive material 48' can be reduced by chemical-mechanical polishing (CMP) and/or etching. Therefore, the planarization process can be provided by CMP. Other planarization processes can include grinding and polishing.

Top view 65 illustrates the cylindrical PCM structure. The phase change material 44', the top electrode 46', and the conductive material 48' each have a substantially cylindrical shape extending through the first stack layers 30, 32, 34, 36, 38 and the second stack layers 62-76. The phase change material 44', the top electrode 46', and the conductive material 48' each have a tapered configuration. The top end of the tapered configuration has a critical dimension that is greater than or larger than the critical dimension of the bottom end of the tapered configuration.

The layers 68, 76 can be, e.g., dielectric layers. The layers 64, 72 can be, e.g., thermal insulator layers. The layers 62, 66, 70, 74 can be, e.g., conductive layers or bottom electrodes or bottom electrode films. Therefore, a plurality of dielectric layers, a plurality of thermal insulator layers, and a plurality of conductive layers can be employed to form the stacked layers. The plurality of dielectric layers, the plurality of thermal insulator layers, and the plurality of conductive layers can be formed in various alternating configurations or schemes to reduce thermal dissipation.

Figure 7:
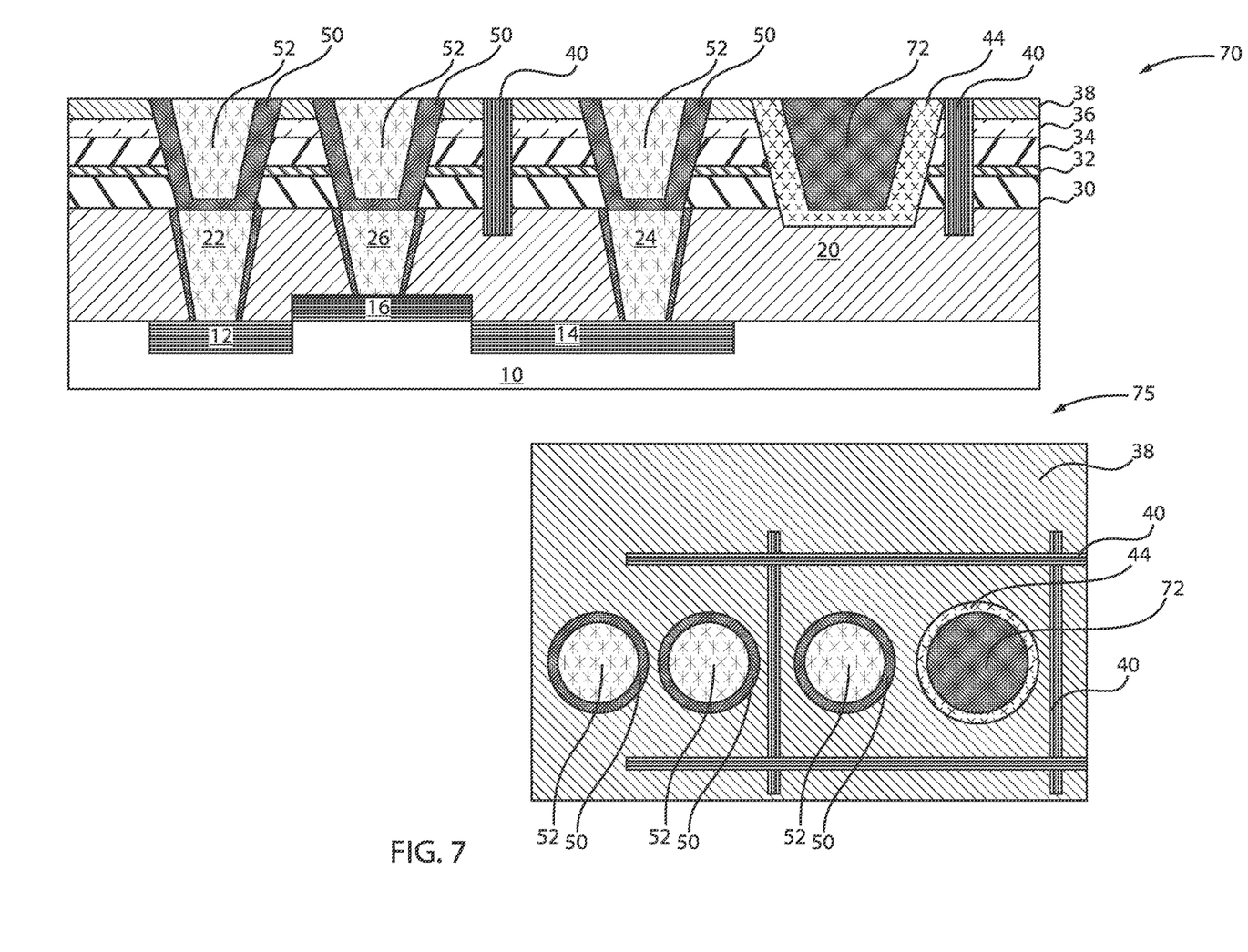
FIG. 7 is a cross-sectional view of a structure where an opening between isolation trenches is filled with a phase change material, in accordance with another embodiment of the present invention.

FIG. 7 is a cross-sectional view of a structure 70 where an opening between isolation trenches is filled with a phase change material, in accordance with another embodiment of the present invention.

In various example embodiments, the cavity 42 of FIG. 3 is filled only with a phase change material 44 and a top electrode 72. The phase change material 44 directly contacts the inner walls or surfaces of the cavity 42 and directly contacts the ILD 20. The top electrode 72 can be deposited within the phase change material 44.

A height of the phase change material 44 and the top electrode 72 can be reduced by chemical-mechanical polishing (CMP) and/or etching. Therefore, the planarization process can be provided by CMP. Other planarization processes can include grinding and polishing.

The electrode 72 can be, e.g., formed from Ta, Ti/TiN, W, WN, TaN, polysilicon, doped polysilicon, amorphous silicon, doped amorphous silicon, or any other suitable material, or any other conductive material. Alternatively, the electrode 72 can be, e.g., any suitable conductive material or materials, e.g., Ag, Al, Cu, Ta, TaN, Ti, TiN, Al, W or any other suitable material, and can be deposited or formed in any suitable manner.

Top view 75 illustrates the cylindrical PCM structure. The phase change material 44 and the top electrode 72 have a substantially cylindrical shape extending through the first stack layers 30, 32, 34, 36, 38. The phase change material 44 and the top electrode 72 have a tapered configuration. The top end of the tapered configuration has a critical dimension that is greater than or larger than the critical dimension of the bottom end of the tapered configuration.

Regarding FIGS. 1-7, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B)

only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for constructing a cylindrical phase change memory PCM structure (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing a three-dimensional (3D) stack phase change memory (PCM) device, the method comprising:

forming a plurality of stack layers in direct contact with a plurality of conductive lines, the plurality of conductive lines formed within trenches of an inter-layer dielectric (ILD);

forming isolation trenches extending through the plurality of stack layers;

etching the plurality of stack layers to define an opening;

filling the opening with at least a phase change material; and constructing vias to the plurality of conductive lines.

2. The method of claim 1, wherein the plurality of stack layers include a bottom electrode film confined between thermal insulator layers.

3. The method of claim 2, wherein dielectric layers are formed adjacent the thermal insulator layers.

4. The method of claim 3, wherein the thermal insulator layers reduce thermal dissipation.

5. The method of claim 1, wherein the isolation trenches extend into the ILD.

6. The method of claim 1, wherein the phase change material includes Ge—Sb—Te (germanium-antimony-tellurium or GST).

7. The method of claim 6, wherein a top electrode is deposited within the GST.

8. The method of claim 7, wherein a conductive material is deposited within the top electrode.

9. The method of claim 6, wherein the GST has a cylindrical shape.

10. A method for constructing a cylindrical phase change memory (PCM) structure, the method comprising:

forming a plurality of stack layers in direct contact with a plurality of conductive lines, the plurality of stack layers including at least thermal insulator layers;

forming isolation trenches extending through the plurality of stack layers;

etching the plurality of stack layers to define a cavity; and filling the cavity with at least a phase change material.

11. The method of claim 10, wherein the plurality of stack layers include a bottom electrode film confined between the thermal insulator layers.

12. The method of claim 11, wherein dielectric layers are formed adjacent the thermal insulator layers.

13. The method of claim 10, wherein the thermal insulator layers reduce thermal dissipation.

14. The method of claim 10, wherein the isolation trenches extend into an inter-layer dielectric (ILD) including the plurality of conductive lines.

15. The method of claim 10, wherein the phase change material includes Ge—Sb—Te (germanium-antimony-tellurium or GST).

16. The method of claim 15, wherein a top electrode is deposited within the GST.

17. The method of claim 16, wherein a conductive material is deposited within the top electrode.

18. A cylindrical phase change memory (PCM) structure, the structure comprising:

a plurality of stack layers disposed in direct contact with a plurality of conductive lines, the plurality of conductive lines formed within trenches of an inter-layer dielectric (ILD);

isolation trenches extending through the plurality of stack layers;

a phase change material disposed within an opening formed in the plurality of stack layers; and a top electrode disposed adjacent the phase change material in the opening.

19. The structure of claim 18, wherein the phase change material includes Ge—Sb—Te (germanium-antimony-tellurium or GST).

20. The structure of claim 18, wherein the plurality of stack layers include a bottom electrode film confined between thermal insulator layers.

* * * * *